United States Patent [19]

Rudolph

[11] 4,162,453

[45] Jul. 24, 1979

[54] DURATION RANGE DETERMINATION OF INCURSIONS BY A VARIABLE SIGNAL

[75] Inventor: Ralph G. Rudolph, Edgewood Borough, Pa.

[73] Assignee: United States Steel Corporation, Pittsburgh, Pa.

[21] Appl. No.: 819,531

[22] Filed: Jul. 27, 1977

[51] Int. Cl.² .......................... H03K 5/20; H03K 9/08
[52] U.S. Cl. .................................... 328/111; 307/361; 328/127; 328/150
[58] Field of Search ............... 328/138, 139, 111, 112, 328/127, 150; 307/360, 361

[56] References Cited

U.S. PATENT DOCUMENTS

| | | | |
|---|---|---|---|
| 3,086,174 | 4/1963 | Zoerner | 328/139 |
| 3,205,454 | 9/1965 | Lowe | 328/151 X |
| 3,600,688 | 8/1971 | Booth | 328/112 X |
| 3,609,563 | 9/1971 | Zinn | 328/111 X |
| 3,800,234 | 3/1974 | Myren | 328/112 |

Primary Examiner—John S. Heyman
Attorney, Agent, or Firm—Rea C. Helm

[57] ABSTRACT

A circuit for determining the duration range of each incursion by a variable signal on one side of a selected level uses a comparator with a reference crossing level to develop a squared waveform pulse output. Each pulse is integrated and the value gated to a plurality of comparators. The comparators have inhibit interconnections and reference inputs for the desired ranges.

5 Claims, 2 Drawing Figures

DURATION RANGE DETERMINATION OF INCURSIONS BY A VARIABLE SIGNAL

BACKGROUND OF THE INVENTION

This invention relates to an electronic circuit for determining whether the duration of each incursion by a variable signal on one side of a selected level occurs within a selected range. In the analysis of data from various processes, it is desirable to divide frequency data into smaller ranges indicative of process characteristics, as for example in measuring surface characteristics. Prior methods for such data analysis have been relatively crude, using standard filtering techniques which lack high sensitivity, or have been relatively complex using full scale spectrum analyzers. For low frequency signals of fractional cycles per second up to several hundred cycles per second, it is not possible to easily construct tunable filters of variable pass band with high rejection.

SUMMARY OF THE INVENTION

In accordance with my invention a variable input signal of indeterminate shape is connected to the input of a comparator having a reference crossing level reference input thereby providing a squared wave pulse output. An integrator provides an intermediate output having a magnitude which is proportional to the width of the comparator pulses. The integrator output is connected to a plurality of comparators, each one having a reference input proportional to one limit of a desired pulse width range. The comparators have an inhibit interconnection to set the other limit to each desired range.

DESCRIPTION OF THE PREFERRED EMBODIMENTS

Figure 1:
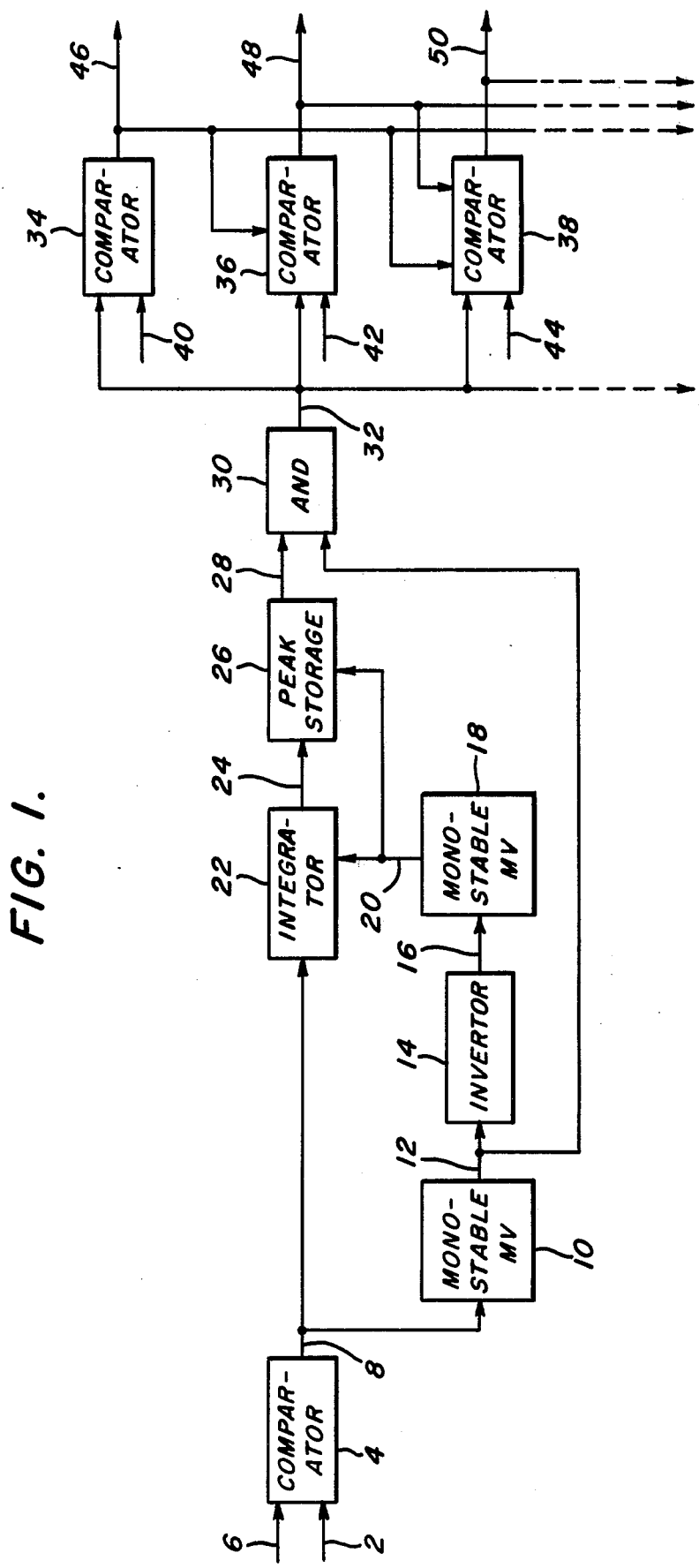
FIG. 1 is a schematic diagram of the circuit of my invention.
Figure 2:
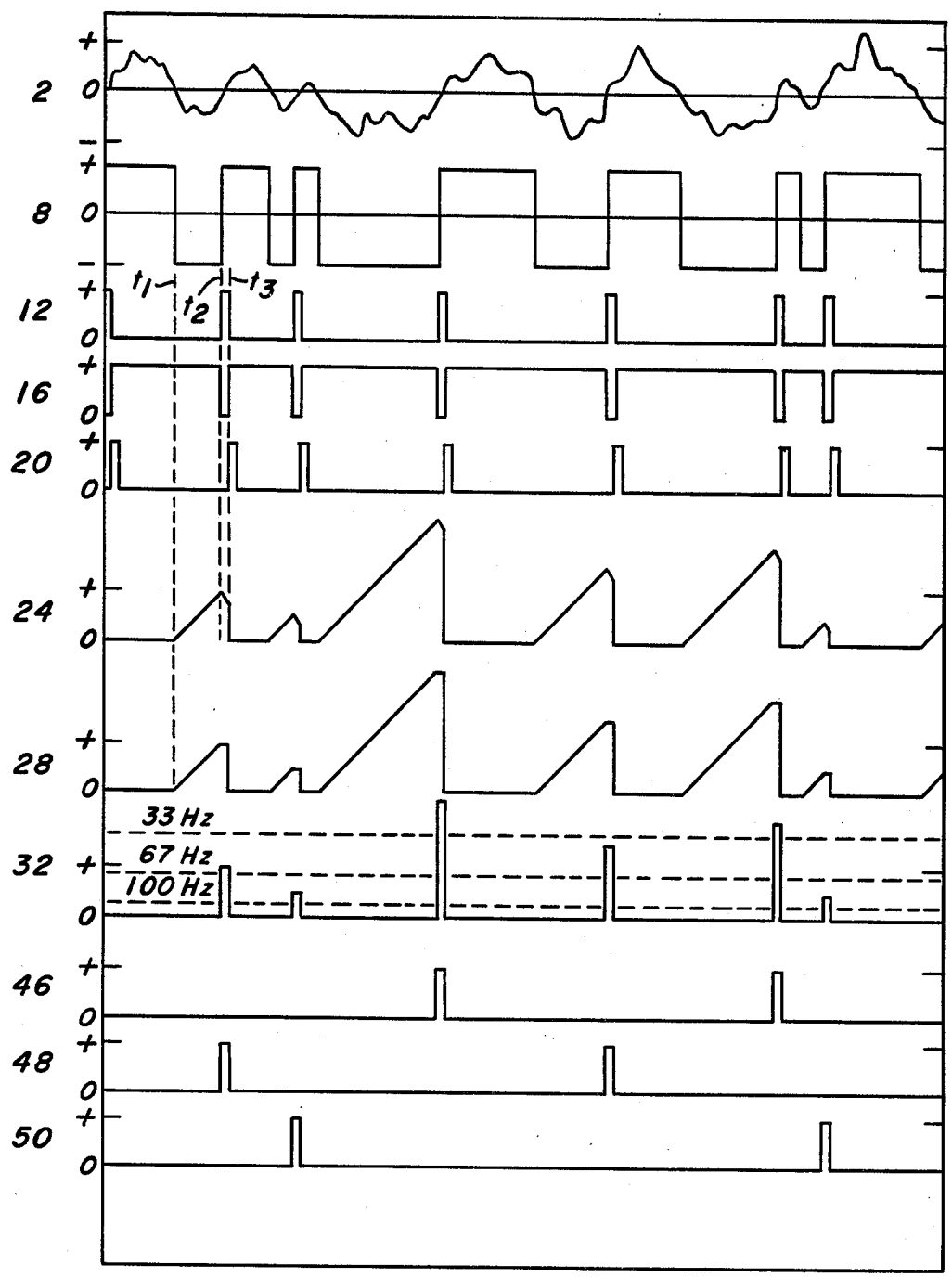
FIG. 2 is a timing diagram showing waveforms of signals at corresponding points in the circuit of FIG. 1.

Referring now to FIGS. 1 and 2, reference numeral 2 indicates a variable input signal of indeterminate shape, such as the output of a displacement sensitive transducer scanning a surface to determine surface roughness, connected to the input of a comparator 4. Comparator 4 has a reference input 6 which may be set to provide reference crossings as shown in FIG. 2. It is desired to determine the duration, with respect to selected ranges, of each incursion of a signal 2 on one side of the reference crossing level, described hereafter as negative incursions. Comparator 4 has an output 8 which changes between a fixed full positive level and a fixed full negative level each time input 2 crosses the reference level thereby providing a squared waveform output.

Output 8 is connected to an input of a first monostable multivibrator 10. Multivibrator 10 provides a sample pulse output 12 upon the occurrence of a trailing edge of a negative going pulse of output 8 assuming it is desired to determine the duration ranges of incursions below the zero crossing level. Output 12 is connected to an input of an inverter 14. Inverter 14 has an output 16 connected to the input of a second monostable multivibrator 18. Monostable multivibrator 18 has a reset output 20.

Output 8 of comparator 4 is also connected to a first input of an integrator 22. Integrator 22 has an output 24 which increases linearly during the negative pulse of output 8 and then may have the characteristic of a slight decay from the peak value after the trailing edge of the pulse has passed as shown in FIG. 2. Output 24 is connected to a first input of a peak storage circuit 26 which stores the most positive value reached by output 24. Output 20 of monostable multivibrator 18 is connected to a second input of integrator 22 for resetting integrator 22 and a second input of peak storage circuit 26 for resetting peak storage circuit 26. Circuit 26 has an output 28 connected to the first input of an AND gate 30. Output 12 of monostable multivibrator 10 is also connected to a second input of AND gate 30. AND gate 30 has an output 32 connected to the first inputs of a plurality of comparators, three of which are shown as 34, 36 and 38. The number of comparators corresponds with the number of selected ranges for incursion durations. Comparators 34, 36 and 38 each have a second, or reference input 40, 42 and 44 respectively. Comparators 34, 36 and 38 each have an output 46, 48 and 50 respectively. Output 46 of comparator 34 is connected to an inhibit input of all other comparators, shown in FIG. 1 as comparators 36 and 38. Output 48 of comparator 36 is connected to an inhibit input of all other comparators except comparator 34, shown in FIG. 1 as connected to comparator 38. Output 50 of comparator 38 is connected to an inhibit input of all additional comparators except comparators 34 and 36. Additional comparators, if any, are connected in a similar manner.

Reference voltage 6 is set for a desired level, for example, a voltage representative of a given percentage of full scale roughness of a surface. Reference inputs 40, 42 and 44 are each set at a voltage level for the desired turn on voltage of each comparator, typically comparator 34 is set for the highest voltage representing the longest pulse length. For example, for a given scan speed, 40 may be set for pulse lengths or incursion durations representative of frequencies up to 33 Hz, 42 set for up to 67 Hz and 44 set for up to 100 Hz.

With the reference levels set as described above, each time input 2 crosses the reference level, the squared waveform 8 shown in FIG. 2 is produced by comparator 4. Multivibrator 10 then provides a sample pulse output 12 of fixed height and duration at the trailing edge of each negative going pulse of output 8. The height of output 12 must be set to exceed the maximum possible level of output 28 and the duration must not be too long to interfere with additional incursions, as for example, not more than one-fourth of the smallest possible pulse of output 8 to be detected on the last of the output comparators. Inverter 14 converts the sample pulse to output 16. At the leading edge of each pulse of output 16 monostable multivibrator 18 provides a reset pulse 20 of fixed height and duration.

During each negative going pulse of output 8, for example starting at $t_1$, and ending at $t_2$, integrator 22 generates a linearly increasing voltage 24 which reaches a peak at $t_2$, the end of the negative going pulse, and then may start to linearly decrease until time $t_3$, the end of the selected width of sample pulse 12. During the period from $t_2$ to $t_3$, the maximum voltage of output 24, a voltage proportional to the pulse length of waveform 8 is stored in peak storage circuit 26 and appears at output 28.

At time $t_2$, the sample pulse 12 turns on AND gate 30 until time $t_3$. AND gate 30 produces an output equal to the lower of the two input voltages and therefore AND gate 30 output 32 is a pulse of duration $t_2$ to $t_3$ of a height equal to the signal stored in peak storage circuit 26.

At time $t_3$, output 20 from multivibrator 18 provides a reset pulse to discharge an integrating capacitor in integrator 22 and a storage capacitor in peak storage circuit 26. The reset pulse should be of sufficient duration to completely discharge the storage capacitors used.

Assuming that the reference inputs 40, 42 and 44 are set for 33 Hz, 67 Hz respectively so that there will be three selected ranges of 0-33 Hz, 34-66 Hz and 67-100 Hz, the first (left) pulse shown in waveform 32 of FIG. 2 is large enough to turn on both comparator 36 and comparator 38. Once comparator 36 turns on, output 48 provides an inhibiting pulse to comparator 38 which prevents it from turning on, thus only output 48 is present. Comparator 38 may actually turn on because of a small switching delay of comparator 36, but the total turn-on time is only of microseconds duration, which may be removed by filtering. The second pulse shown on waveform 32 will only turn on comparator 38 to provide output 50 and the third pulse will be large enough to turn on all comparators. However, on the third pulse, the pulse output 46 will inhibit the output from comparators 36 and 38 and only output 46 will be present.

As indicated in FIG. 2, the circuit shown is designed to detect incursions below the reference level within selected length ranges; it can also be designed to detect incursions above the reference level. Pulse outputs 46, 48 and 50 may be connected to individual counters or other devices for displaying the information on the duration ranges of the incursions.

I claim:

1. A circuit for determining whether the duration of each incursion by a variable signal on one side of a selected level occurs within a selected range comprising
   means for generating a squared waveform signal having pulses corresponding to each incursion by the variable signal from the selected level,
   an integrator circuit connected to the generating means for providing a first intermediate signal indicative of the duration of each pulse resulting from incursions on one side of the selected level,
   a gating circuit connected to the generating means and the integrator circuit and responsive to the trailing edge of each pulse for providing an intermediate pulse having a magnitude corresponding to the first intermediate signal, and
   a comparator circuit connected to the gating circuit for providing an output signal when the magnitude of the intermediate pulse exceeds a reference signal input corresponding to one limit of the selected range.

2. A circuit according to claim 1 in which the comparator circuit includes a plurality of comparators, one for each selected range, with each comparator having a reference signal input corresponding to one limit of its selected range and which includes circuit means connected to all comparators and responsive to a comparator output signal for inhibiting the output of all other comparators having a reference signal input smaller than the reference signal input of the comparator having said output signal.

3. A circuit according to claim 2 which includes a peak storage circuit connected to the integrator circuit for storing the integrator circuit output and in which the gating circuit includes a first monostable multivibrator connected to the means for generating a squared waveform and responsive to the trailing edge of the squared waveform for generating a sample pulse and an AND gate connected to the monostable multivibrator and the peak storage circuit and responsive to a sample pulse for providing the intermediate pulse to the comparator circuit.

4. A circuit according to claim 3 which includes a second monostable multivibrator connected to the first monostable multivibrator, the integrator circuit and the peak storage circuit and responsive to the sample pulse for providing a reset pulse to the integrator circuit and the peak storage circuit.

5. A circuit according to claim 4 in which the means for generating a squared waveform signal is a comparator with a selectable level reference input.

* * * * *

UNITED STATES PATENT AND TRADEMARK OFFICE
CERTIFICATE OF CORRECTION

PATENT NO. : 4,162,453
DATED : July 24, 1979
INVENTOR(S) : Ralph G. Rudolph

It is certified that error appears in the above-identified patent and that said Letters Patent are hereby corrected as shown below:

Column 3, line 40, claim 1, before "pulses" insert -- a fixed full positive level and a fixed full negative level and with --;

Column 4, line 1, claim 1, after "each" insert -- fixed level --;

line 3, claim 1, delete "the generating means";

line 4, claim 1, delete "and" first occurrence;

same line, claim 1, before "responsive" insert -- to the generating means independent of the integrator circuit and --;

line 5, claim 1, after "each" insert -- fixed level --.

Signed and Sealed this

Fourth Day of December 1979

[SEAL]

Attest:

SIDNEY A. DIAMOND

Attesting Officer       Commissioner of Patents and Trademarks